United States Patent [19]
Koroncai et al.

[11] Patent Number: 5,986,441
[45] Date of Patent: Nov. 16, 1999

[54] CIRCUIT CONFIGURATION FOR CAPTURING THE LOAD CURRENT OF A POWER SEMICONDUCTOR COMPONENT WITH A LOAD ON THE SOURCE SIDE

[75] Inventors: Adam-Istvan Koroncai, Klagenfurt, Austria; Jenoe Tihanyi, Kirchheim, Germany

[73] Assignee: Siemens Aktiengesellschaft, Munich, Germany

[21] Appl. No.: 09/250,869

[22] Filed: Feb. 16, 1999

Related U.S. Application Data

[63] Continuation of application No. PCT/DE97/01621, Jul. 31, 1997.

[51] Int. Cl.[6] .................................................. G05F 1/573
[52] U.S. Cl. ............................ 323/277; 323/279; 327/52
[58] Field of Search ..................................... 323/273, 274, 323/275, 276, 277, 278, 279, 280, 312, 313, 314, 315, 316, 317; 327/51, 52

[56] References Cited

U.S. PATENT DOCUMENTS

| | | | |
|---|---|---|---|
| 4,914,542 | 4/1990 | Wagoner | 323/277 |
| 5,004,970 | 4/1991 | Barou | 323/277 |
| 5,008,586 | 4/1991 | Miyazaki et al. | 323/315 |
| 5,164,659 | 11/1992 | Schultz et al. | 323/351 |
| 5,220,207 | 6/1993 | Kovalcik et al. | 307/350 |

FOREIGN PATENT DOCUMENTS

| | | |
|---|---|---|
| 0227149A1 | 7/1987 | European Pat. Off. . |
| 0294880A2 | 12/1988 | European Pat. Off. . |
| 0294882A2 | 12/1988 | European Pat. Off. . |
| 0365697A1 | 5/1990 | European Pat. Off. . |
| 0430354A2 | 6/1991 | European Pat. Off. . |
| 69011713T2 | 8/1994 | Germany . |
| 7113826 | 2/1995 | Japan . |
| 2217938A | 11/1989 | United Kingdom . |

OTHER PUBLICATIONS

"Surviving Short Circuits", Randy Frank et al., Machine Design, Mar. 1990, pp. 89–96.

*Primary Examiner*—Y. J. Han
*Attorney, Agent, or Firm*—Herbert E. Lerner; Laurence A. Greenberg

[57] ABSTRACT

The circuit configuration captures the load current of a field effect-controllable power semiconductor component. The drain and gate terminals of a further field effect-controllable semiconductor component are connected to the drain and gate terminals, respectively, of the first semiconductor component. A fraction of the load current flows through the further semiconductor component. The load current of the further semiconductor component is set as a function of the drain-to-source voltage of the two semiconductor components. The load current flowing through the further semiconductor component is compared with a reference current and an output signal is generated if the load current falls below a set value.

7 Claims, 1 Drawing Sheet

CIRCUIT CONFIGURATION FOR CAPTURING THE LOAD CURRENT OF A POWER SEMICONDUCTOR COMPONENT WITH A LOAD ON THE SOURCE SIDE

CROSS-REFERENCE TO RELATED APPLICATION

This is a continuation of copending International Application PCT/DE97/01621, filed Jul. 31, 1997, which designated the United States.

BACKGROUND OF THE INVENTION

Field of the Invention

The invention relates to a circuit configuration for capturing the load current in the case of small currents of a field effect-controllable power semiconductor component. The configuration includes a further field effect-controllable semiconductor component, wherein the drain and gate terminals of the two semiconductor components are connected to one another, and a fraction of the load current flows through the further semiconductor component. The load current of the further semiconductor component is set as a function of the drain-to-source voltage of the two semiconductor components. The load current flowing through the further semiconductor component is compared with a reference current and an output signal is generated if the load current falls below a set value. A controllable device generates a drive signal for the semiconductor components. European published patent application EP 0 294 882 describes a circuit configuration with an intelligent high-side power switch designed as a MOSFET, and with a second MOSFET for current sensing. The gate and drain terminals of the two MOSFETs are in each case connected to one another. A fraction of the load current of the load MOSFET flows through the second MOSFET. Furthermore, the circuit configuration has a current capture apparatus. In order to capture the load current, the source terminals of the load MOSFET and the second MOSFET are respectively routed to an input of an operational amplifier whose output controls a third MOSFET. The load path of the third MOSFET is connected in series with the load path of the second MOSFET. As a result of this, the current of the second MOSFET can be set in such a way that the drain-to-source voltage of the load MOSFET and the second MOSFET correspond. A comparison between the measured current and the reference current is determined by means of a reference current source. A logic signal is generated in dependence on the difference between the reference current and the sense current through the second MOSFET.

U.S. Pat. No. 5,004,970 describes a circuit configuration for detecting a load current through a load connected in series with a power MOSFET. The current is less than a predetermined reference current. The object is to detect a load interruption. The circuit configuration has a voltage detection device which comprises a second MOSFET, a resistor, and an operational amplifier and monitors the drain-to-source voltage of the power MOSFET. The power MOSFET and the second MOSFET are thereby connected in such a way that the two source terminals and the gate terminals are connected to one another. Given the same drain-to-source voltage of the power MOSFET and the second MOSFET, a fraction of the load current through the second MOSFET flows through the second MOSFET on account of the smaller number of cells. The circuit configuration furthermore has a feedback path with a further operational amplifier, the voltage across the load and the reference voltage being fed as input signals to the further operational amplifier. The output of the further operational amplifier controls the gate terminals of the power MOSFET and the second MOSFET in such a way that the gate-source voltage is reduced as soon as the voltage across the load becomes less than the reference voltage at the further operational amplifier.

Such a circuit configuration has been described for example in the article "Surviving Short Circuits" by R. Frank and A. Pshaenich, Machine Design, Mar. 8, 1990, pages 89–96. The article explains the principle whereby the load current of a power MOSFET can be captured by connecting a similar MOSFET with a smaller area in parallel with the power MOSFET and connecting a measuring resistor in series with the smaller MOSFET, the so-called "sense" FET, on the source side. If the power FET is connected to a load on the drain side, then a current which is approximately proportional to the load current flows through the further FET. The proportionality factor in that case depends on the ratio of the current-carrying areas of the sense FET to that of the power FET. If a load current flows through the load and thus through the power FET, then a part that is approximately proportional to the load current thus flows through the sense FET and the measuring resistor. A voltage which is approximately proportional to the load current can then be picked off at the measuring resistor.

It is a precondition that the measuring resistor be coordinated with the load. In the case of a different load, therefore, it is necessary to change either the measuring resistor or the evaluation logic that captures the voltage.

Accordingly, the voltage drop across the power transistor is measured in the prior art. If the voltage drop falls below a predetermined value, for example 10 mV, a logic signal is generated which signals a no-load state. The level of the no-load threshold is thus dependent on the on-resistance of the power transistor and is consequently inaccurate. Furthermore, the error becomes ever greater during measurement in the case of small load currents.

SUMMARY OF THE INVENTION

It is accordingly an object of the invention to provide a circuit configuration for capturing the load current of a power semiconductor component with a load on the source side, which overcomes the above-mentioned disadvantages of the heretofore-known devices and methods of this general type and which operates precisely even in the case of small load currents and has an accurate no-load identification circuit.

With the foregoing and other objects in view there is provided, in accordance with the invention, a circuit configuration for capturing the load current of a field effect-controllable power semiconductor component, comprising:

a first field effect-controllable power semiconductor component having a drain, a gate, a source and a drain-to-source voltage, and having a load connected to the source; a second field effect-controllable semiconductor component having a drain connected to the drain of the first field effect-controllable power semiconductor component, a gate connected to the gate of the first field effect-controllable power semiconductor component, a source, and a drain-to-source voltage;

a fraction of a load current, adjusted in dependence on the drain-to-source voltage of the first and second semiconductor components, flowing through the second semiconductor component;

a comparator comparing the load current flowing through the second semiconductor component with a reference current and generating an output signal if the load current falls below a set value;

a controllable device for generating a driving signal for the first and second semiconductor components; and a switching device connected to the controllable device for selectively switching the controllable device on and off in dependence on the load current of the second semiconductor component and as a function of the load current of the first semiconductor component.

The circuit according to the invention advantageously uses the "sense" current, instead of the voltage drop, for determining a logic signal.

In accordance with an added feature of the invention, the gate and the source of the first semiconductor component are connected to one another via a resistor.

In accordance with an additional feature of the invention, the controllable device has a control input, and the switching device comprises an operational amplifier connected to receive a reference voltage derived from the load current of the second semiconductor component and a voltage across the load, the operational amplifier having an output connected to the control input of the controllable device.

In accordance with another feature of the invention, a third semiconductor component has its load path connected in series with the load path of the second semiconductor component, and an operational amplifier is provided for setting the load current through the second semiconductor component, the operational amplifier having an input connected to the source of the first semiconductor component, an input connected to the source of the second semiconductor component, and an output connected to the gate of the third semiconductor component.

In accordance with a further feature of the invention, the controllable device for generating the driving signal comprises a controllable oscillator with a charge pump connected downstream in a signal flow direction.

In accordance with again a further feature of the invention, the load current through the second semiconductor component is evaluated by comparing the load current with a reference current and generating a reference voltage, whereby the reference voltage is generated as a function of the load current if the load current falls below the reference current and remains constant if the load current is not below the reference current.

In accordance with a concomitant feature of the invention, an output stage is provided for generating a digital output signal.

Other features which are considered as characteristic for the invention are set forth in the appended claims.

Although the invention is illustrated and described herein as embodied in a circuit configuration for capturing the load current of a power semiconductor component with a load on the source side, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
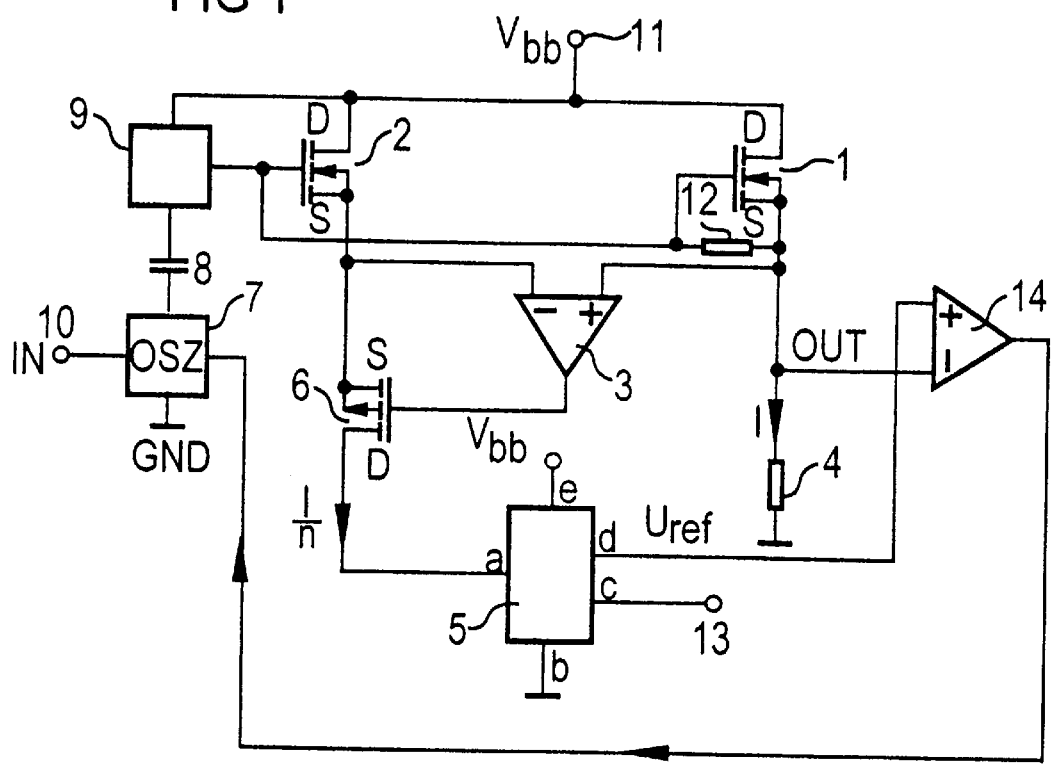
FIG. 1 is a circuit schematic of a circuit configuration according to the invention.

Referring now to the figures of the drawing in detail and first, particularly, to FIG. 1 thereof, there is seen a power semiconductor component 1 in the form of a MOSFET whose drain is connected to a supply voltage terminal 11. The source terminal is connected to ground via a load 4. A sense FET 2 is provided whose drain is likewise connected to the supply voltage terminal 11. The source of the sense FET 2 is connected via the load path of a further MOSFET 6 to an input a of an evaluation device 5. An operational amplifier 3 is provided whose positive input is connected to the source of the power MOSFET 1 and whose inverting input is connected to the source of the MOSFET 2. The output of the operational amplifier 3 is connected to the gate of the MOSFET 6. The gate terminals of the power MOSFET 1 and of the sense MOSFET 2 are shorted and connected to the output of a charge pump 9. The charge pump 9 is connected, on the one hand, to the supply voltage terminal 11 and is connected via a capacitor 8 to the output of an oscillator 7, which has an input connected to an input terminal 10. The oscillator 7 is furthermore connected to ground. The evaluation device 5 is connected to the supply voltage and ground via corresponding connecting lines e and b. The evaluation device 5 furthermore has outputs d and c, with the output c being connected to an output terminal 13. The output d is connected to the noninverting input of a further operational amplifier 14, whose inverting input is connected to the source terminal of the power MOSFET 1. The gate terminal of the power MOSFET 1 is connected via a resistor 12 to its source terminal. The output of the operational amplifier 14 is coupled to a control input of the oscillator 7.

Figure 2:
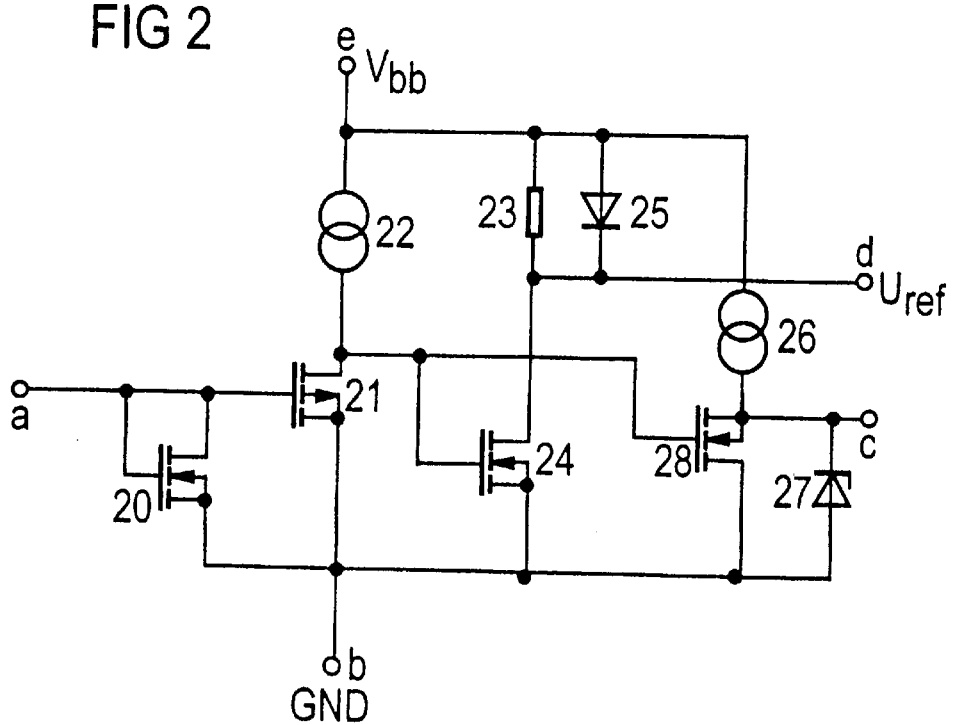
FIG. 2 is a circuit schematic of the block 5 shown in FIG. 1.

Reference will now be had to FIG. 2, wherein an embodiment of the evaluation device 5 is illustrated. The connecting terminal a is connected to the gate terminal and the drain terminal of a MOSFET 20. It is furthermore connected to the gate terminal of a MOSFET 21. The drain terminal of the MOSFET 21 is connected via a current source 22 to the connecting terminal e. The connecting terminal e is furthermore connected via a resistor 23 to the drain terminal of a further MOSFET 24. A diode 25 is connected in parallel with the resistor 23 in the forward direction. Moreover, the connecting terminal e is connected via a current source 26 to the drain terminal of a MOSFET 28 and to the output terminal c. The source terminals of the MOSFETs 20, 21, 24 and 28 are connected to the connecting terminal b. A Zener diode 27 is connected in the reverse direction between the drain terminal and the source terminal of the MOSFET 28. The drain terminal of the MOSFET 21 is connected to the gate terminal of the MOSFET 24 and to the gate terminal of the MOSFET 28. The drain terminal of the MOSFET 24 is connected to the output terminal d.

According to FIG. 1, when an input voltage is applied to the terminal 10, the oscillator is activated, as a result of which the charge pump commences operation and turns on the power MOSFET 1 and the sense MOSFET 2. Consequently, current flows through the load 4 and a different potential is established at the input terminals of the operational amplifier 3. The operational amplifier 3 compensates for this difference by driving the MOSFET 6. In effect, this means that the load resistor 4 is proportionally simulated by the load path of the MOSFET 6. In the case of small currents through the power MOSFET 1, however, the voltage across the load 4 also becomes small and the error of an operational amplifier enters the regulating operation to an increasing extent. In order to avoid this, the load current I/n through the MOSFET 6, which current forms a fraction of the load current I through the load 4, is fed to the input of the evaluation device 5. The latter generates from this load current a correspondingly high reference voltage and a logic signal. The reference voltage is fed to the noninverting input of the operational amplifier 14, which compares this reference voltage with the voltage drop across the load 4. The output signal of the operational amplifier 14 enables the oscillator 7 to be switched off in the absence of a load or in the event of a loss of load. The task of the evaluation device 5 is to generate from the sense current at the input a a reference voltage at the output terminal d and to generate a logic voltage for no-load signaling at the output c.

The exemplary embodiment illustrated in FIG. 2 is provided, in this regard, with a first comparator stage by means of the transistors 20 and 21. The comparator stage compares the incoming proportional load current with the current of the current source 22. If the proportional load current at the input a is less than the reference current 22, then the voltage drop across the resistor 23 determines the reference voltage at the output d. The voltage drop of the power transistor 1 is corrected onto this voltage. The diode 25 limits the reference voltage to, say, 0.7 V referring to the supply voltage $V_{bb}$ at the input terminal e. At the same time, the comparator stage 20, 21 switches the level auxiliary stage 26, 27, where the logic signal "no-load" is generated. The entire circuit configuration is accordingly independent of the on-resistance of the power MOSFET 1 and is consequently stable with respect to temperature.

The invention has been described above with reference to a high-side switch. It should be understood, however, that it can also be applied to a low-side switch, in which case the load 4 is situated on the drain side of the two MOSFETs, while the controllable switch 6 and the measuring resistor 5 remain connected on the source side of the MOSFET 2.

We claim:

1. A circuit configuration for capturing the load current of a field effect-controllable power semiconductor component, comprising:

a first field effect-controllable power semiconductor component having a drain, a gate, a source and a drain-to-source voltage, and having a load connected to said source;

a second field effect-controllable semiconductor component having a drain connected to said drain of said first field effect-controllable power semiconductor component, a gate connected to said gate of said first field effect-controllable power semiconductor component, a source, and a drain-to-source voltage;

a fraction of a load current, adjusted in dependence on the drain-to-source voltage of said first and second semiconductor components, flowing through said second semiconductor component;

a comparator comparing the load current flowing through said second semiconductor component with a reference current and generating an output signal if the load current falls below a set value;

a controllable device for generating a driving signal for said first and second semiconductor components; and a switching device connected to said controllable device for selectively switching said controllable device on and off in dependence on the load current of said second semiconductor component and as a function of the load current of said first semiconductor component.

2. The circuit configuration according to claim 1, which further comprises a resistor connected between said gate and said source of said first semiconductor component.

3. The circuit configuration according to claim 2, wherein said controllable device has a control input, and said switching device comprises an operational amplifier connected to receive a reference voltage derived from the load current of said second semiconductor component and a voltage across the load, said operational amplifier having an output connected to said control input of said controllable device.

4. The circuit configuration according to claim 1, which further comprises a third semiconductor component having a gate and having a load path connected in series with the load path of said second semiconductor component, and an operational amplifier for setting the load current through said second semiconductor component, said operational amplifier having an input connected to said source of said first semiconductor component, an input connected to said source of said second semiconductor component, and an output connected to said gate of said third semiconductor component.

5. The circuit configuration according to claim 1, wherein said controllable device for generating the driving signal comprises a controllable oscillator with a charge pump connected downstream in a signal flow direction.

6. The circuit configuration according to claim 1, wherein the load current through said second semiconductor component is evaluated by comparing the load current with a reference current and generating a reference voltage, whereby the reference voltage is generated as a function of the load current if the load current falls below the reference current and remains constant if the load current is not below the reference current.

7. The circuit configuration according to claim 1, which comprises an output stage for generating a digital output signal.

* * * * *

UNITED STATES PATENT AND TRADEMARK OFFICE
CERTIFICATE OF CORRECTION

PATENT NO : 5,986,441
DATED : November 16, 1999
INVENTOR(S) : Adam-Istvan Koroncai et al.

It is certified that error appears in the above-identified patent and that said Letters Patent is hereby corrected as shown below:

On the title page:
Item [30] should read as follows:

Aug. 14, 1996    [DE]   Germany .......... 196 32 812.8

Signed and Sealed this

Seventh Day of November, 2000

Attest:

Q. TODD DICKINSON

*Attesting Officer*    *Director of Patents and Trademarks*